US006696669B2

(12) United States Patent
Hembree et al.

(10) Patent No.: US 6,696,669 B2
(45) Date of Patent: Feb. 24, 2004

(54) CIRCUIT AND METHOD FOR HEATING AN ADHESIVE TO PACKAGE OR REWORK A SEMICONDUCTOR DIE

(75) Inventors: David R. Hembree, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/205,826

(22) Filed: Jul. 25, 2002

(65) Prior Publication Data
US 2002/0175153 A1 Nov. 28, 2002

Related U.S. Application Data

(63) Continuation of application No. 09/942,221, filed on Aug. 29, 2001, now Pat. No. 6,426,484, which is a continuation of application No. 09/620,182, filed on Jul. 20, 2000, now Pat. No. 6,339,210, which is a continuation of application No. 09/338,242, filed on Jun. 22, 1999, now Pat. No. 6,111,220, which is a continuation of application No. 08/711,201, filed on Sep. 10, 1996, now Pat. No. 5,938,956.

(51) Int. Cl.[7] .............................. H05B 1/00; H02G 3/08
(52) U.S. Cl. ....................................... 219/209; 174/52.1
(58) Field of Search ................................. 219/209, 553; 228/123.1, 124.1, 124.6; 174/52.1, 52.2, 52.3, 52.4, 53.5; 257/666, 667, 668, 676, 704

(56) References Cited

U.S. PATENT DOCUMENTS

| 4,256,945 A | 3/1981 | Carter et al. |
|---|---|---|
| 4,448,306 A | 5/1984 | Sinnadurai et al. |
| 4,623,401 A | 11/1986 | Derbyshire et al. |
| 4,695,713 A | 9/1987 | Krumme |
| 4,701,587 A | 10/1987 | Carter et al. |
| 4,717,814 A | 1/1988 | Krumme |
| 4,745,264 A | 5/1988 | Carter |
| 4,769,525 A | 9/1988 | Leatham |
| 4,792,683 A | 12/1988 | Chang et al. |
| 5,010,233 A | 4/1991 | Henschen et al. |
| 5,117,279 A | 5/1992 | Karpman |
| 5,175,409 A | 12/1992 | Kent |
| 5,194,695 A | 3/1993 | Maslakow |
| 5,239,806 A | 8/1993 | Maslakow |
| 5,418,189 A | 5/1995 | Heinen |
| 5,498,899 A | 3/1996 | Palara |
| 5,500,555 A | 3/1996 | Ley |
| 5,521,426 A | 5/1996 | Russell |
| 5,596,171 A * | 1/1997 | Harris et al. ............... 174/52.4 |
| 5,598,031 A | 1/1997 | Groover et al. |
| 5,673,845 A * | 10/1997 | Ball ......................... 228/180.5 |
| 5,840,599 A * | 11/1998 | Lamson et al. ............. 438/123 |
| 5,938,956 A * | 8/1999 | Hembree et al. ........... 219/209 |
| 6,111,220 A * | 8/2000 | Hambree et al. ........... 219/209 |
| 6,339,210 B1 * | 1/2002 | Hembree et al. ........... 219/209 |
| 6,426,484 B1 * | 7/2002 | Hembree et al. ........... 219/209 |

* cited by examiner

*Primary Examiner*—Sang Y. Paik
(74) *Attorney, Agent, or Firm*—TraskBritt

(57) ABSTRACT

System for attaching a die to the die pad of a lead frame incorporating a resistive heating circuit into the die pad which heats up to cure an epoxy adhesive between the die and the pad and thereby attach the die to the pad. The heating circuit also heats up to loosen the adhesive so the die can be detached from the pad for rework.

16 Claims, 6 Drawing Sheets

CIRCUIT AND METHOD FOR HEATING AN ADHESIVE TO PACKAGE OR REWORK A SEMICONDUCTOR DIE

CROSS-REFERENCE TO RELATED APPLICATIONS

This application is a continuation of application Ser. No. 09/942,221, filed Aug. 29, 2001, now U.S. Pat. No. 6,426,484, issued Jul. 30, 2002, which is a continuation of application Ser. No. 09/620,182, filed Jul. 20, 2000, now U.S. Pat. No. 6,339,210, issued Jan. 15, 2002, which is a continuation of application Ser. No. 09/338,242, filed Jun. 22, 1999, now U.S. Pat. No. 6,111,220, issued Aug. 29, 2000, which is a continuation of application Ser. No. 08/711,201, filed Sep. 10, 1996, now U.S. Pat. No. 5,938,956, issued Aug. 17, 1999.

BACKGROUND OF THE INVENTION

1. Field of the Invention

This invention relates in general to semiconductor dice and, in particular, to devices and methods for heating adhesives and other attachment materials to package or rework semiconductor dice.

2. State of the Art

Semiconductor dice are small, generally rectangular integrated circuit (IC) devices cut from a semiconductor wafer, such as a silicon wafer, on which multiple ICs have been fabricated. Bare dice are typically packaged to protect them from corrosion and physical damage by attaching them to a base, such as a lead frame or a printed circuit board, with a die-attach material, such as an epoxy or polyamide resin, cured in an oven, and then encapsulated in thermosetting plastic. In some instances, bare dice are attached to a printed circuit board and enclosed by a cover that is attached to the printed circuit board with an attachment material, such as a thermoset material, that requires additional curing in an oven.

This use of ovens for curing die-attach materials and attachment materials can be problematic for a number of reasons. Ovens are expensive to operate and take up precious room on the floor of a semiconductor manufacturing facility. Also, in addition to curing die-attach materials and attachment materials, ovens undesirably heat everything else on a printed circuit board or package as well, including solder joints, other adhesive joints, and other electronic devices. As a result, ovens can be destructive when sufficient care is not taken in their use. Further, because ovens cannot direct heat at individual dice or packages, they cannot be used to detach an individual die for reworking, or to detach a die cover from a package for reworking the die inside the package, without also detaching or destroying electronic devices that share a printed circuit board with the die.

In an attempt to eliminate the problems associated with heating semiconductor dice in an oven, in some instances, heaters have been embedded in printed circuit boards for use in the soldering of a semiconductor device to the printed circuit board and in attachment/disassembly operations. Such arrangements are shown in U.S. Pat. Nos. 5,010,233 and 5,175,409.

However, such prior art arrangements use heaters to heat large areas or the entirety of printed circuit boards or substrates, not specific localized areas of a predetermined configuration.

Therefore, there is a need in the art for a device that can direct heat at a specific area of an individual die or package to cure a die-attach material or attachment material associated therewith, or to loosen a previously cured die-attach material or attachment material associated therewith for detaching and reworking the die.

SUMMARY OF THE INVENTION

A system for attaching or removing for repair a bare die to a base, such as a lead frame, includes a heat-activated die-attach material, such as a suitable adhesive, interposed between a localized die-attach region on the base and the back surface of the die. A heating circuit, such as a thin-film resistor, integral with the base in substantial registry with the localized die-attach region generates heat in response to being electrically energized in order to activate the die-attach material. As a result, the system avoids the cumbersome use of ovens to heat the die-attach material. Instead, the system advantageously directs heat at the individual die to attach the die to the base by curing the die-attach material, or to detach the die from the base for rework by loosening the die-attach material.

In another embodiment of the present invention, a system for sealing a bare die in an enclosure, such as a Chip-Scale-Package, includes a heat-activated attachment material, such as a thermoset or thermoplastic material, interposed between the enclosure's die cover and base at the interface therebetween. A heating circuit integral with either the base or the die cover in substantial registry with the interface therebetween generates heat in response to being electrically energized in order to activate the attachment material. As a result, the system advantageously directs heat at the interface between the enclosure's die cover and base to attach the die cover to the base by curing the attachment material, or to detach the die cover from the base by loosening the attachment material for repair purposes.

In an additional embodiment, the previously summarized system for sealing a bare die in an enclosure includes a heat-activated, electrically resistive attachment material, such as a conductive epoxy adhesive, interposed between the die cover and the base in place of the heating circuit. In this embodiment, the attachment material itself generates heat in response to being electrically energized in order to attach or detach the die cover.

DETAILED DESCRIPTION OF THE INVENTION

Figure 1:
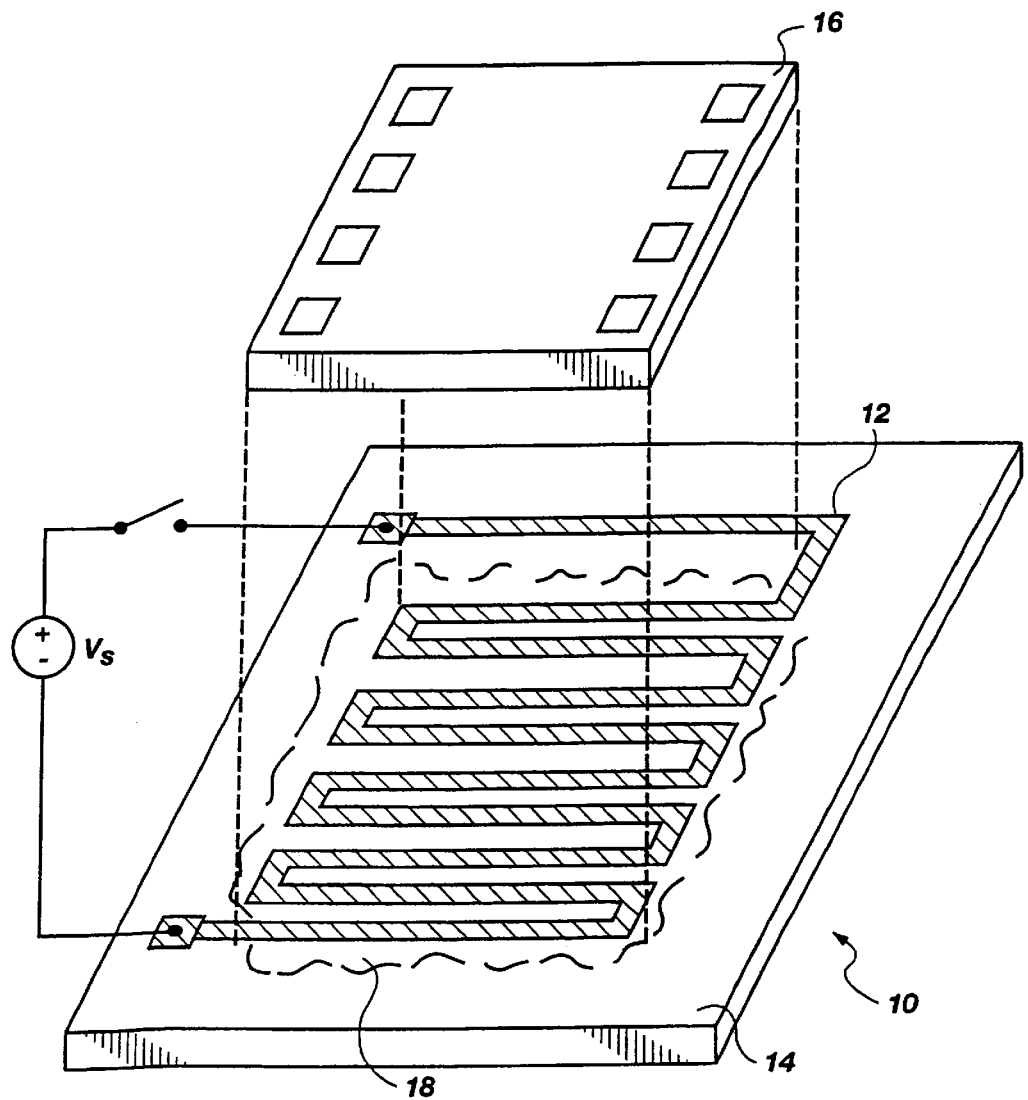
FIG. 1 is an exploded isometric view of a semiconductor die attached to a lead frame die pad using a heating circuit that is integral with the pad in accordance with the present invention.

A die support member 10 of the present invention shown in FIG. 1 includes a heating circuit 12 integral with a base 14, such as a lead frame die pad 14. The heating circuit 12 is generally located on or near the surface of the base 14 for improved heating efficiency in a localized area of the base. Alternatively, the heating circuit 12 may be placed on the base 14 to provide a uniform heating of the entire base or predetermined portion thereof. It will be understood by those having skill in the field of this invention that any heating circuit capable of being integrated with a base will work for purposes of this invention, including resistance-connected Metal-Oxide Semiconductor (MOS) transistors connected in series, doped resistors, epitaxial-layer resistors, pinch resistors, thin-film resistors, diffused resistors, deposited resistors, plated resistors, etched resistors, etched resistors having been etched into a substrate, polysilicon resistors, and Complimentary-MOS (CMOS) well-type resistors. Also, although this embodiment of the present invention will be described with respect to a die support member having a lead frame die pad for a base, it will be understood that the present invention is applicable to any die support member having a base, including Single In-Line Memory Modules (SIMMs), Dual In-Line Memory Modules (DIMMs), etc. The base 14 may include lead frames, either conventional or Lead-Over-Chip type, a silicon substrate having a passivated surface, a glass epoxy printed circuit board, a printed circuit board including a SIMM, DIMM, or other multi-chip modules, etc. It should be understood that the present invention is not limited to the shape and configuration of the illustrated heating circuit 12 as the heating circuit 12 can include other shapes and variations.

The heating circuit 12 attaches a bare semiconductor die 16, such as a Dynamic Random Access Memory (DRAM) die, to the lead frame die pad 14 by heating and curing a die-attach material 18 on the surface of the lead frame die pad 14 in response to being energized by a supply voltage $V_S$ or current supply.

A wide variety of well-known die-attach materials will work for purposes of this invention, including polymers, such as polyamide and epoxy adhesives, eutectic materials, gold/silicon eutectic materials, eutectic solders, thermosetting materials, thermoplastic materials, conducting polyamides, conductive epoxy, and other suitable heat sealants. Of course, the heating circuit 12 can also be used to detach the bare semiconductor die 16 from the lead frame die pad 14 for purposes of reworking or replacing the bare semiconductor die 16. Furthermore, the heating circuit 12 can also be configured or shaped to provide more heat or uniform heat to predetermined parts of the die attach material and portion of the substrate or the entire substrate through variations in the shape and size of the heating circuit 12.

Because the inventive heating circuit is associated in close proximity with a single die, the heat it generates is localized and/or concentrated and/or uniform with respect to that die. As a result, unlike conventional oven curing, the heating circuit of the present invention can attach or detach a die in the presence of neighboring electronic devices, solder joints, and adhesive joints without the excessive heating thereof.

Figure 2:
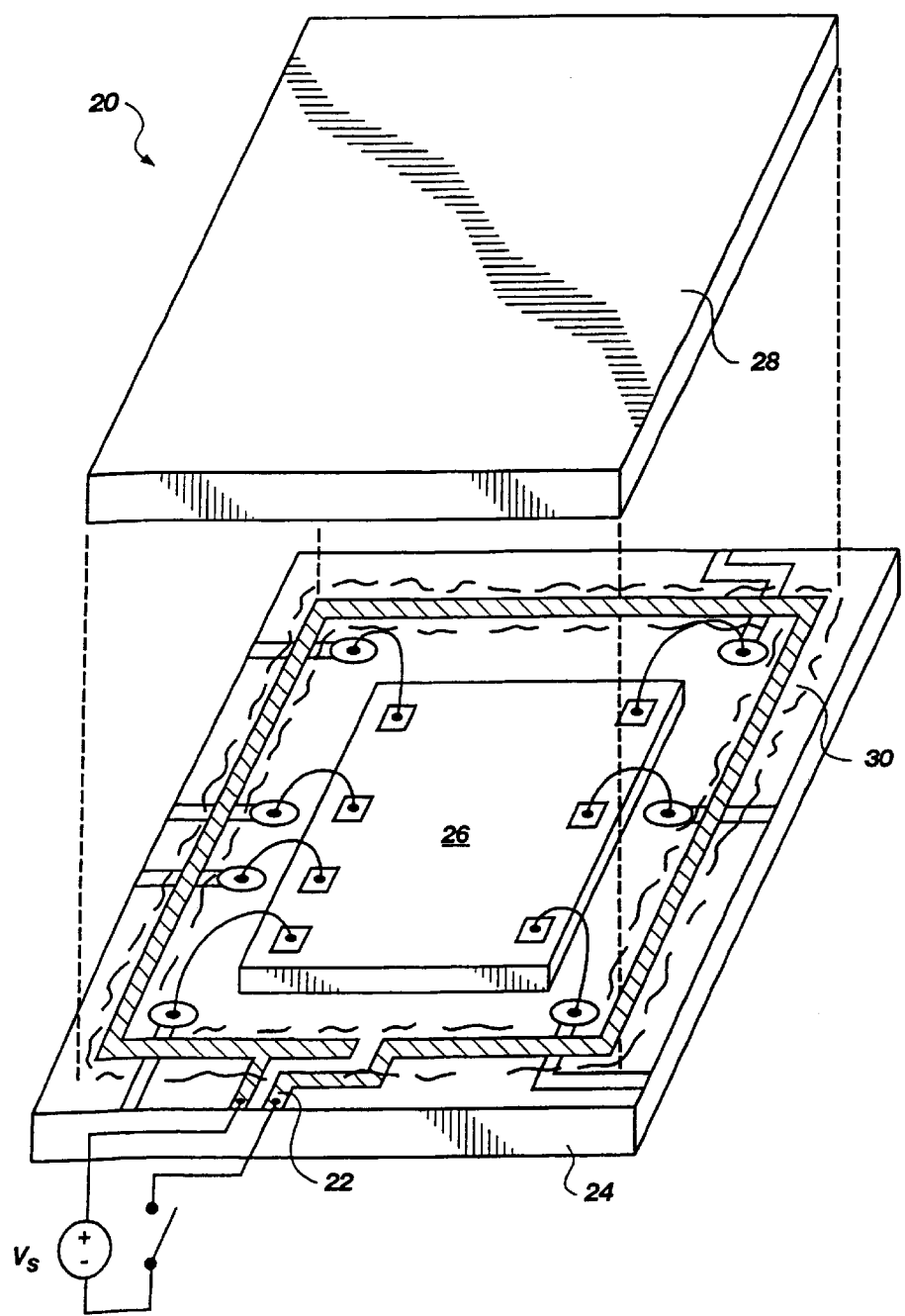
FIG. 2 is an exploded isometric view of a semiconductor die directly attached to a printed circuit board and enclosed by a die cover attached to the board using a heating circuit that is integral with the board in accordance with the present invention.

In another embodiment of the present invention shown in FIG. 2, a die support member 20 includes a heating circuit 22 integral with a base, such as a glass-epoxy printed circuit board 24. A bare semiconductor die 26 is attached to the printed circuit board 24 using well-known Chip-On-Board (COB) or Direct Chip-Attach (DCA) methods such as die-bond/wire-bond, Tape-Automated Bonding (TAB), or Controlled-Collapse Chip Connection (C4). If desired, the bare semiconductor die 26 may include a Known-Good-Die (KGD).

The heating circuit 22 attaches a die cover 28 to the printed circuit board 24 by heating and curing an attachment material 30 on the surface of the printed circuit board 24 in response to being energized by a supply voltage VS or a current supply. A wide variety of well-known attachment materials, such as set forth hereinbefore will work for this purpose. Of course, if a thermoplastic type adhesive is used, the heating circuit 22 can also be used to detach the die cover 28 from the printed circuit board 24 for purposes of testing, reworking or replacing the bare semiconductor die 26.

It should be understood that the heating circuit 22 will work for purposes of this invention if it is incorporated into the die cover 28 rather than the printed circuit board 24. Also, it should be understood that the printed circuit board 24 can include another heating circuit integral therewith underneath the bare semiconductor die 26 for purposes of attaching and detaching the bare semiconductor die 26 from the printed circuit board 24. Further, it should be understood that the heating circuit 22 can be eliminated if the attachment material 30 is sufficiently conductive to act as a heating circuit itself. Well-known conductive attachment materials include eutectic solders and metal-filled epoxy and polyamide adhesives. In any event, the heating circuit 22, whether contained on the printed circuit board 24 and/or die cover 28, employs localized heating of the printed circuit board 24 and die cover 28 without excessive heating of other areas of the printed circuit board 24 or die cover 28. Furthermore, the heating circuit 22 not only provides localized heat but it provides a very uniform heating of the printed circuit board 24 and/or die cover 28. Additionally, the die cover 28 may form a hermetic seal with the printed circuit board 24, if desired, through the use of a suitable attachment material and the heating circuit 22.

Figure 3:
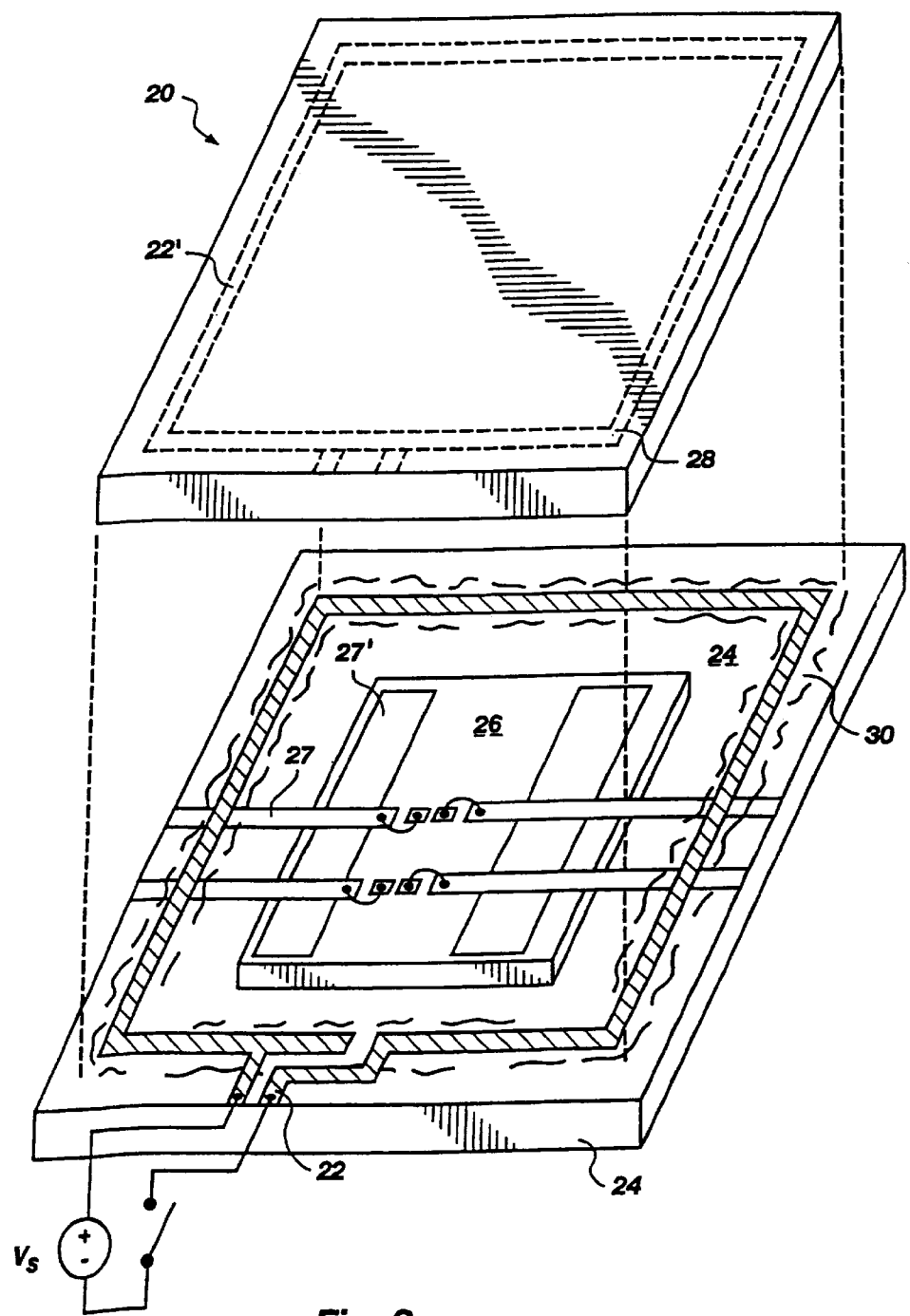
FIG. 3 is an exploded isometric view of a Lead-Over-Chip type semiconductor die enclosed between a substrate board and a die cover attached to the substrate board using a heating circuit that is integral with the substrate board and/or in the die cover in accordance with the present invention.

In another embodiment of the present invention shown in FIG. 3, a die support member 20 includes a heating circuit 22 integral with a base, such as a glass-epoxy printed circuit board 24. A bare semiconductor die 26 is attached to the leads 27 of a lead frame using adhesive tape strips 27' using well-known Lead-Over-Chip (LOC) technology.

The heating circuit 22 attaches a die cover 28 to the printed circuit board 24 by heating and curing an attachment material 30 on the surface of the printed circuit board 24 in response to being energized by a supply voltage $V_S$ or current supply. A wide variety of well-known attachment materials, such as set forth hereinbefore will work for this purpose. Of course, if a thermoplastic type adhesive is used, the heating circuit 22 can also be used to detach the die cover 28 from the printed circuit board 24 for purposes of testing, reworking or replacing the bare semiconductor die 26. Any suitable adhesive may be used to hermetically attach the die cover 28 to the printed circuit board 24.

It should be understood that the heating circuit 22 will work for purposes of this invention if it is incorporated into the die cover 28, shown in phantom as 22', rather than the printed circuit board 24. Also, it should be understood that the printed circuit board 24 can include another heating circuit integral therewith underneath the bare semiconductor die 26 for purposes of attaching and detaching the bare semiconductor die 26 from the printed circuit board 24. Further, it should be understood that the heating circuit 22 can be eliminated if the attachment material 30 is sufficiently conductive to act as a heating circuit itself. Well-known conductive attachment materials include eutectic solders and metal-filled epoxy and polyamide adhesives. In any event, the heating circuit 22, whether contained on the printed circuit board 24 and/or die cover 28, employs localized heating of the printed circuit board 24 and die cover 28 without excessive heating of other areas of the printed circuit board 24 or die cover 28.

Figure 4:
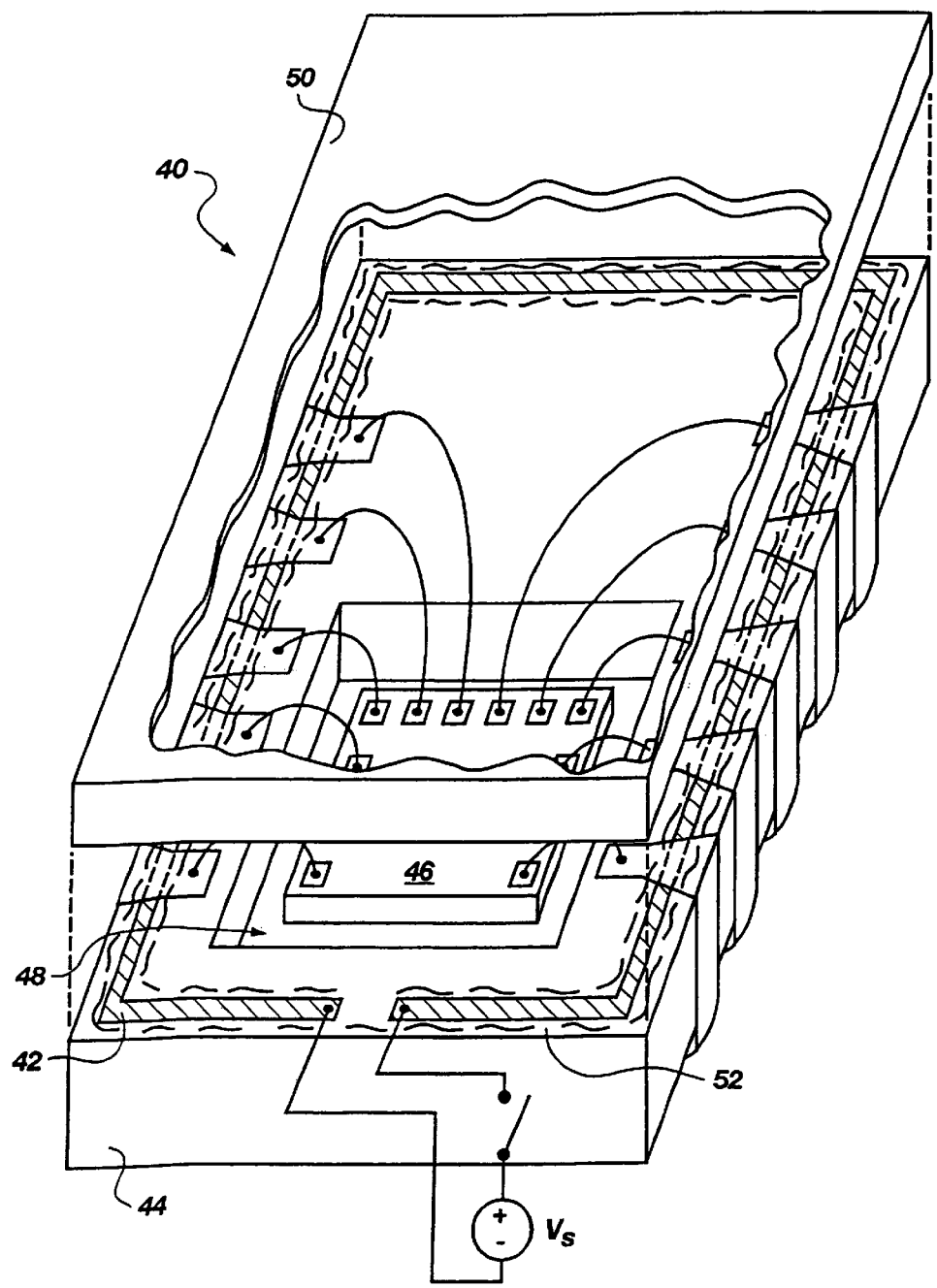
FIG. 4 is an exploded isometric view of a package with its die cover attached to its base using a heating circuit that is integral with the base in accordance with the present invention.

In a further embodiment of the present invention shown in FIG. 4, a die support member, such as a Thin Small Outline Package (TSOP) 40, includes a heating circuit 42 integral with a base 44 of the TSOP 40. A bare semiconductor die 46 is attached to a die-attach area 48 of the base 44 using well-known die-attach methods. The heating circuit 42 attaches a die cover 50 to the base 44 by heating and curing an attachment material 52 on the surface of the base 44 in response to being energized by a supply voltage $V_S$ or current supply. Again, if a thermoplastic type adhesive is used, the heating circuit 42 can also be used to detach the die cover 50 from the base 44 for purposes of testing, reworking or replacing the bare semiconductor die 46. Any suitable adhesive may be used to hermetically seal the die cover 50 to the base 44, as desired. Again, the heating circuit 42 merely locally, uniformly heats up the base 44 and die cover 50 for attachment and disassembly purposes.

Figure 5:
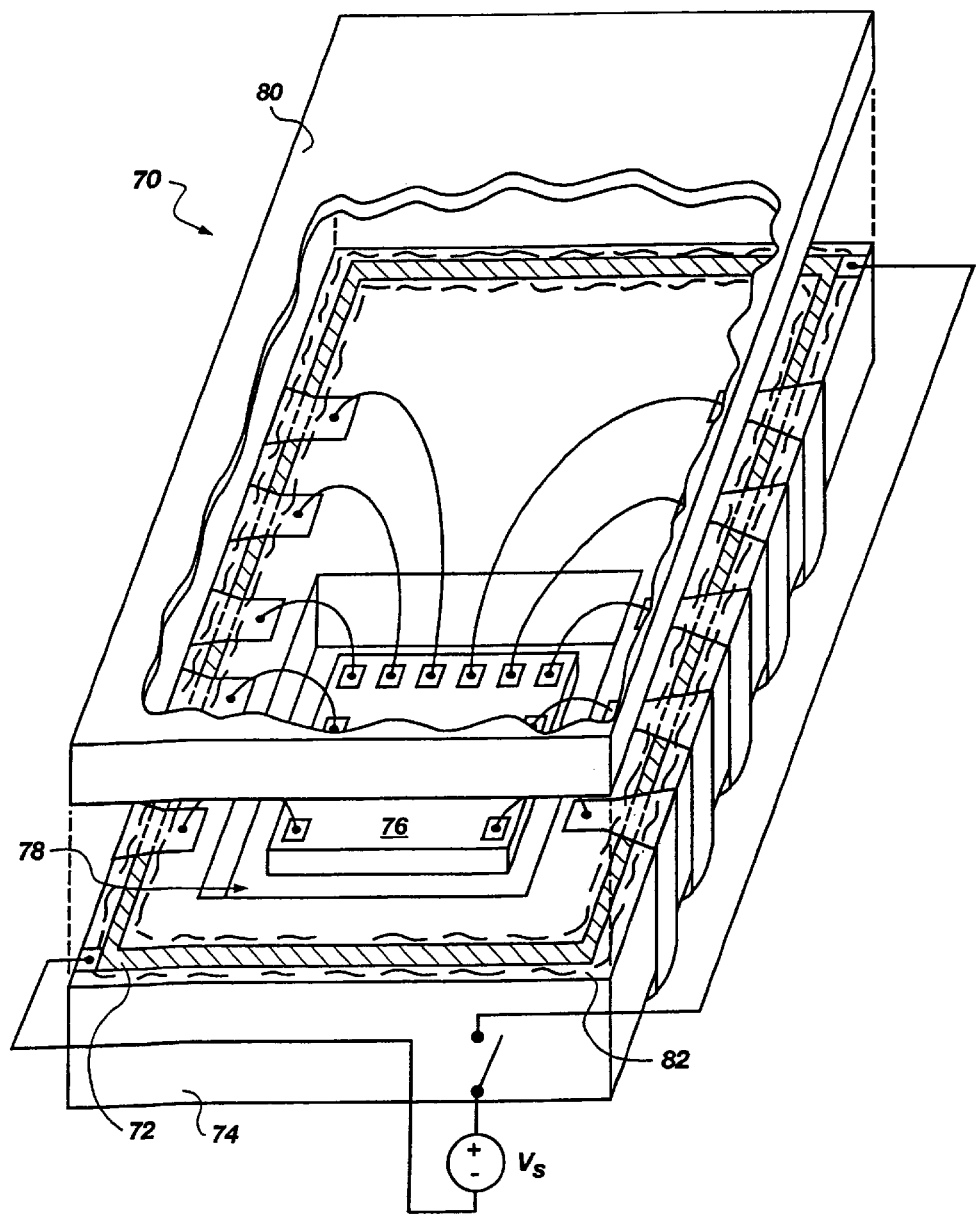
FIG. 5 is an exploded isometric view of a package with its die cover permanently sealed and attached to its base using a heating circuit that is integral with the base in accordance with the present invention.

In yet a further embodiment of the present invention shown in FIG. 5, a die support member, such as a Thin Small Outline Package (TSOP) 70, includes a heating circuit 72 integral with a base 74 of the TSOP 70 extending therearound without any gap therein to be used to seal the base 74 to a die cover 80. A bare semiconductor die 76 is attached to a die-attach area 78 of the base 74 using well-known die-attach methods. The heating circuit 72 attaches and seals a die cover 80 to the base 74 by heating and curing an attachment material 82 on the surface of the base 74 in response to being energized by a supply voltage $V_S$ or current supply. If a thermoplastic type adhesive is used, the heating circuit 72 can also be used to detach the die cover 80 from the base 74 for purposes of testing, reworking or replacing the bare semiconductor die 76. Suitable adhesives may be used to hermetically seal the die cover 80 to the base 74. Again, the heating circuit 72 merely locally heats up the base 74 and die cover 80 for attachment and disassembly purposes.

Figure 6:
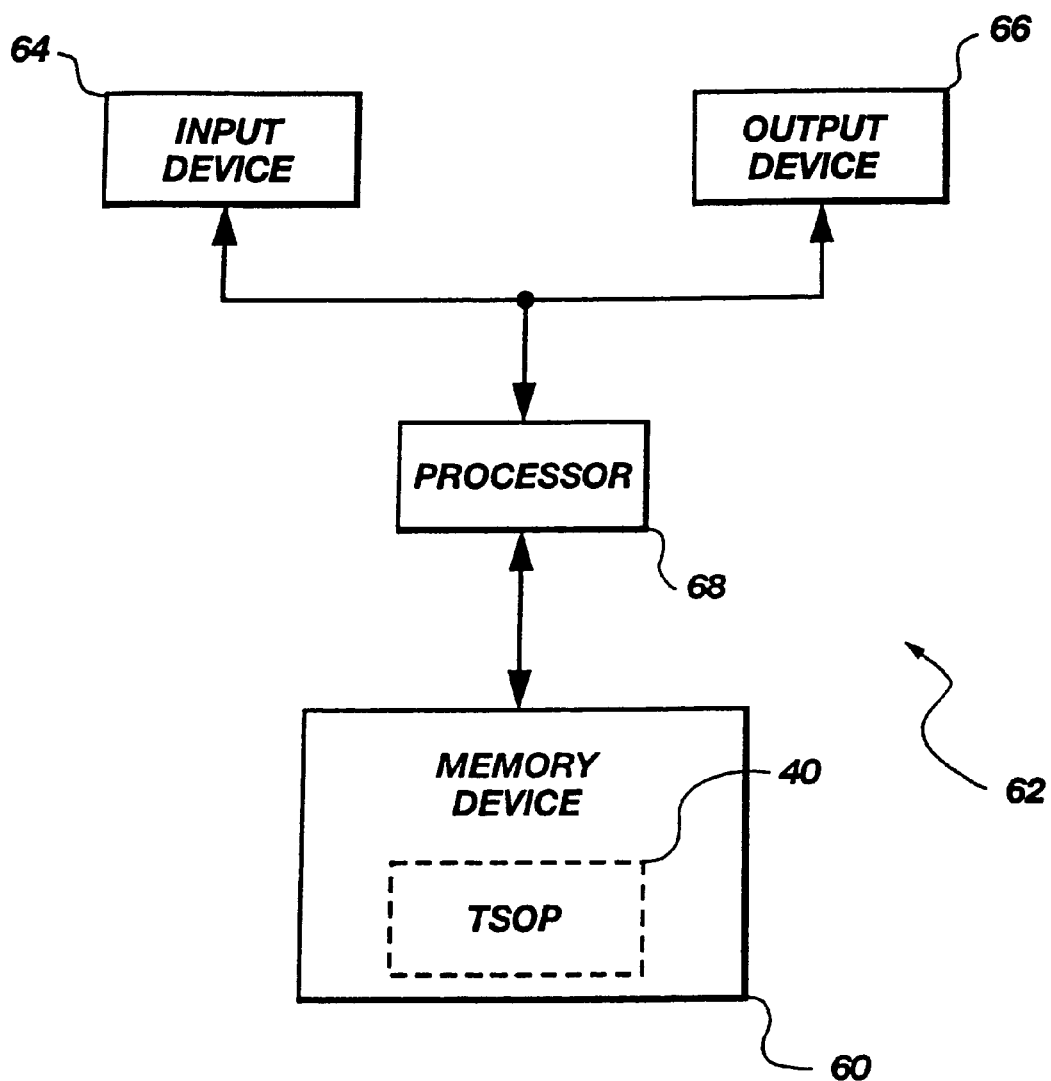
FIG. 6 is a block diagram of an electronic system including the package of FIG. 4.

As shown in FIG. 6, the TSOP 40 of FIG. 4 can be incorporated into a memory device 60 of an electronic system 62, such as a computer system, that includes an input device 64 and an output device 66 coupled to a processor 68. Of course, any suitable type TSOP 40 can alternatively be incorporated into the input device 64, the output device 66, or the processor 68. Alternatively, the processor 68, or any desired type semiconductor device, may be packaged as described hereinbefore using such configurations as described hereinbefore or the like.

The previously described invention provides a convenient device and method for die-attach, and for attaching a die cover, without the need for a cumbersome cure oven. The invention also provides a previously unavailable method for detaching a die or die cover for testing, reworking or replacing a die.

Although the present invention has been described with reference to certain embodiments, the invention is not limited to these embodiments. For instance, the shape of the heating element of the present invention may be of any desired shape having any desired end connection arrangement to facilitate the desired sealing arrangement to form a hermetically sealed semiconductor die, if so desired. Any desired number of heating circuits may be used to heat localized areas of a substrate, semiconductor die, or die cover to facilitate attachment and disassembly for any desired purpose. Therefore, the invention is limited only by the appended claims, which include within their scope all equivalent devices or methods which operate according to the principles of the invention as described.

What is claimed is:

1. A support member for supporting at least a portion of a semiconductor die assembly thereon comprising:

a die pad having a surface having at least a portion thereof for directly attaching to at least a portion of a surface of a bare semiconductor die using a heat-activated die-attach material disposed between the at least a portion of the die pad and the at least a portion of the surface of the bare semiconductor die, the die pad comprising one of a portion of a lead frame, a printed circuit board, and a die attach portion of a die package, the lead frame including a lead frame having portions of a plurality of leads extending over the portion of the surface of the bare semiconductor die;

a die cover for enclosing the bare semiconductor die, the die cover having at least a portion of a surface thereof for attachment to the die pad at an interface between the die pad and the die cover;

a heat-activated electrically resistive attachment material; and an energizable resistance circuit interposed between the surface of the die cover and the die pad for attaching at least a portion of the die cover to the die pad, the resistance circuit for generating heat.

2. The support member of claim 1, wherein the lead frame comprises a Leads-Over-Chip lead frame.

3. The support member of claim 1, wherein the printed circuit board comprises a glass-epoxy printed circuit board.

4. A support member for a semiconductor die assembly comprising:

a die pad and a die cover for enclosing a bare semiconductor die, the die pad having a surface with a localized die-attach region for directly attaching to at least a portion of a surface of the bare semiconductor die, the die cover having a surface for attaching to at least a portion of the die pad, the die pad comprising one of a portion of a lead frame for direct attachment to the surface of the bare semiconductor die and a die attach portion of a die package, the lead frame including a lead frame having portions of a plurality of leads extending over the portion of the surface of the bare semiconductor die a heat-activated electrically resistive attachment material; and a resistance circuit for interposing between the at least a portion of the surface of the die cover and the at least a portion of the surface of the die pad for attaching the at least a portion of the surface of the die cover to the at least a portion of the surface of the die pad, the resistance circuit for generating heat.

5. The support member of claim 4, wherein the die pad includes the die attach portion of the die package configured for reworking a semiconductor die.

6. The support member of claim 4, wherein the die pad and the die cover together comprise a Chip-Scale-Package.

7. The support member of claim 4, wherein the heat-activated electrically resistive attachment material comprises a conductive epoxy.

8. The support member of claim 7, wherein the conductive epoxy comprises a metal-filled epoxy.

9. The support member of claim 4, wherein the heat-activated electrically resistive attachment material comprises a eutectic material.

10. The support member of claim 9, wherein the eutectic material comprises a gold/silicon eutectic material.

11. The support member of claim 4, wherein the heat-activated electrically resistive attachment material comprises a conducting polyamide.

12. The support member of claim 4, wherein the heat-activated electrically resistive attachment material comprises a solder.

13. An assembly having an electronic device as part thereof including:
  a bare integrated circuit die; and
  a die support member including:
    a die pad and a die cover for enclosing the bare integrated circuit die, the die pad having a portion of a surface thereof for attaching to a portion of a surface of the bare integrated circuit die, the die cover having a surface for attaching a portion thereof to a portion of the die pad using an interface fit therewith for retaining the die cover and the die pad together as an assembly;
    a resistance circuit; and
    a heat-activated electrically resistive attachment material interposed between the portion of the surface of the die cover and the portion of the die pad for attaching the die cover to the die pad, the resistance circuit for generating heat, the attachment material including a conductive epoxy.

14. A heating method for a heat-activated electrically resistive attachment material in one of a packaging and a reworking of a bare semiconductor die, the method comprising:
  providing a resistance circuit;
  providing a heat-activated electrically resistive attachment material interposed between a portion of a die pad and a portion of a die cover, the die cover and the die pad for enclosing a bare semiconductor die attached to the portion of the die pad, the attachment material including a conductive epoxy; and
  energizing the resistance circuit for causing heating of at least a portion of the die cover and at least a portion of the die pad.

15. The method of claim 14, further comprising:
  providing the resistance circuit and the heat-activated electrically resistive attachment material between a portion of the bare semiconductor die and a localized die-attach region on a portion of a surface of the die pad.

16. The method of claim 14, further comprising:
  providing a heat-activated electrically resistive attachment material interposed between the portion of the die pad and a portion of the bare semiconductor die; and
  heating the heat-activated electrically resistive attachment material using at least a portion of the resistance circuit.

* * * * *

UNITED STATES PATENT AND TRADEMARK OFFICE
CERTIFICATE OF CORRECTION

PATENT NO.       : 6,696,669 B2
APPLICATION NO.  : 10/205826
DATED            : February 24, 2004
INVENTOR(S)      : David R. Hembree and Salman Akram It is certified that error appears in the above-identified patent and that said Letters Patent is hereby corrected as shown below:

On the title page:
In ITEM (56) "References Cited,
  U.S. Patent Documents,"
          COLUMN 2,     LINE 23     change "Hambree et al." to --Hembree et al.--

In the drawings:
          In FIG. 3,                shorten the lead line extending from reference numeral 28 to more accurately reflect the die cover (as shown below)

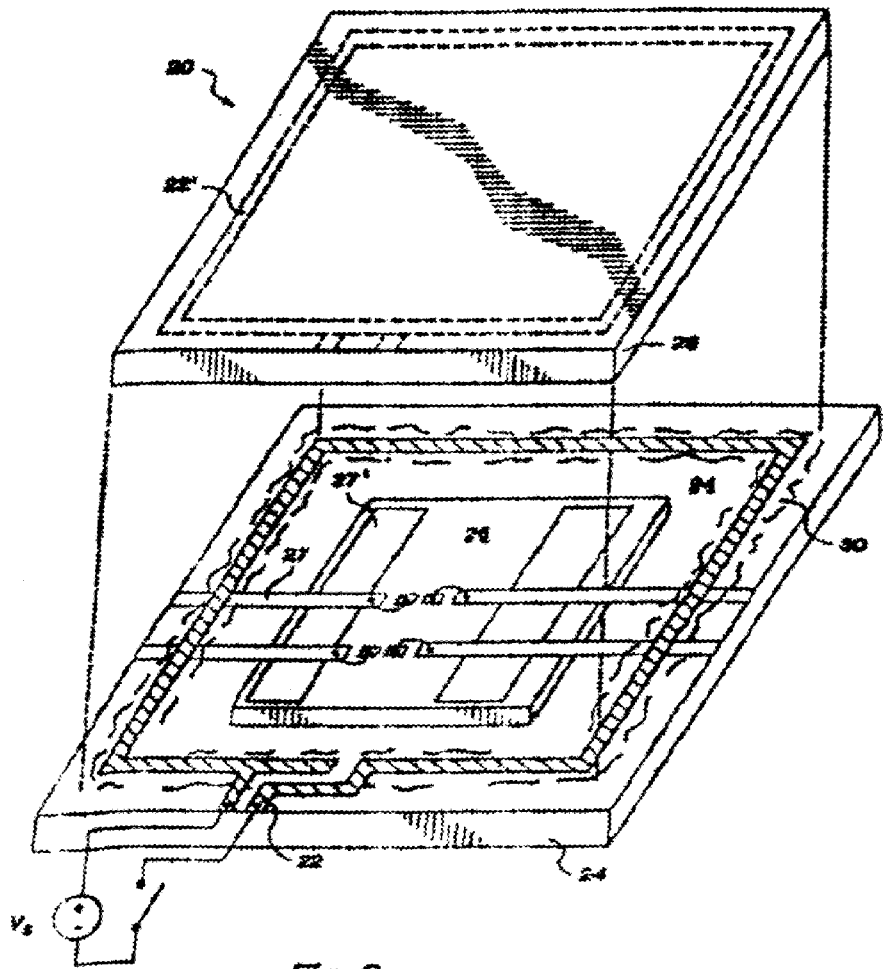

UNITED STATES PATENT AND TRADEMARK OFFICE
CERTIFICATE OF CORRECTION

PATENT NO. : 6,696,669 B2 Page 2 of 2
APPLICATION NO. : 10/205826
DATED : February 24, 2004
INVENTOR(S) : David R. Hembree and Salman Akram It is certified that error appears in the above-identified patent and that said Letters Patent is hereby corrected as shown below:

In the specification:

| | |
|---|---|
| COLUMN 2, LINE 56, | change "Lead-Over-Chip" to --Leads-Over-Chip-- |
| COLUMN 3, LINE 11, | delete the first occurrence of [14] |
| COLUMN 3, LINE 12, | change "base" to --lead frame die pad-- |
| COLUMN 3, LINE 15, | change "base" to --lead frame die pad-- |
| COLUMN 3, LINE 34, | change "Lead-Over-Chip" to --Leads-Over-Chip-- |
| COLUMN 4, LINE 14, | change "VS" to --$V_s$-- |
| COLUMN 4, LINE 50, | change "Lead-Over-Chip" to --Leads-Over-Chip-- |

Signed and Sealed this

Fifteenth Day of January, 2008

JON W. DUDAS
*Director of the United States Patent and Trademark Office*